(12) United States Patent
Escuadra

(10) Patent No.: US 10,964,668 B2
(45) Date of Patent: Mar. 30, 2021

(54) STACKED TRANSISTOR PACKAGES

(71) Applicant: PGS Geophysical AS, Oslo (NO)

(72) Inventor: Jose Miguel Salgado Escuadra, Houston, TX (US)

(73) Assignee: PGS GEOPHYSICAL AS, Oslo (NO)

( * ) Notice: Subject to any disclaimer, the term of this patent is extended or adjusted under 35 U.S.C. 154(b) by 244 days.

(21) Appl. No.: 15/907,840

(22) Filed: Feb. 28, 2018

(65) Prior Publication Data
US 2018/0247918 A1 Aug. 30, 2018

Related U.S. Application Data

(60) Provisional application No. 62/464,450, filed on Feb. 28, 2017.

(51) Int. Cl.
*G01V 1/20* (2006.01)
*H01L 25/065* (2006.01)
*H01L 23/02* (2006.01)

(52) U.S. Cl.
CPC .......... *H01L 25/0657* (2013.01); *G01V 1/201* (2013.01); *H01L 23/02* (2013.01); *H01L 25/0652* (2013.01)

(58) Field of Classification Search
CPC . H01L 25/0657; H01L 23/02; H01L 25/0652; H01L 25/112; H01L 25/117; H01L 23/3675; H01L 25/071; G01V 1/201
See application file for complete search history.

(56) References Cited

U.S. PATENT DOCUMENTS

| 7,291,869 | B2 | 11/2007 | Otremba |
| 7,608,924 | B2 | 10/2009 | Myers et al. |
| 2008/0246162 | A1* | 10/2008 | Kwon ..................... H01L 25/03 257/777 |
| 2012/0106012 | A1 | 5/2012 | Westrum |
| 2014/0015126 | A1* | 1/2014 | Yang .................... H01L 25/0657 257/737 |
| 2014/0061884 | A1 | 3/2014 | Carpenter et al. |
| 2014/0063744 | A1 | 3/2014 | Lopez et al. |
| 2014/0104981 | A1* | 4/2014 | Duboue ................ G01V 1/201 367/15 |
| 2015/0241497 | A1 | 8/2015 | Sellin |

(Continued)

FOREIGN PATENT DOCUMENTS

CN 206180819 U 5/2017

OTHER PUBLICATIONS

"Recommendations for Assembly of Infineon TO Packages," Mar. 2008, 34 pages, Infineon Technologies AG, München, Germany.

(Continued)

*Primary Examiner* — Daniel Pihulic

(57) ABSTRACT

Transistor packages in space-constrained applications are disclosed. An apparatus may comprise a first transistor package and a second transistor package, wherein the first transistor package is stacked upon the second transistor package. The apparatus may further comprise a cover coupled to a printed circuit board (PCB) that is configured to cover at least a portion of the stacked first and second transistor packages. The first and second transistor package may be components in a power circuit that is configured to down-convert a received voltage from a first voltage level to a second, lower voltage level.

18 Claims, 5 Drawing Sheets

(56) References Cited

U.S. PATENT DOCUMENTS

2018/0247918 A1* 8/2018 Escuadra ............... H01L 23/02

OTHER PUBLICATIONS

"Surface Mount and Through-Hole Multilayer Ceramic Chip Stacked Capacitors," Oct. 1, 2014, 25 pages, KEMET Electronics Corporation, Greenville, SC.
"Stacked Ceramic Capacitors," AVX Corporation, as screen captured from http://www.avx.com/products/ceramic-capacitors/stacked/ on Feb. 2, 2021.

* cited by examiner

US 10,964,668 B2

STACKED TRANSISTOR PACKAGES

This application claims the benefit of U.S. Provisional Application No. 62/464,450, filed on Feb. 28, 2017, which is incorporated by reference herein in its entirety.

BACKGROUND

Marine seismic surveying is a technique for investigating geological features underneath bodies of water. As the market calls for more powerful systems, the transistors used typically as electronic switches become bigger in order to achieve the high voltage and low power dissipation requirements. Large transistor packages are difficult to integrate in space constrained applications such as seismic streamers. In the past, some of these real estate issues have been addressed by embedding some of this electronic functionality within canisters with larger dimensions than the streamer itself. This solution causes difficulties with handling and with the overall reliability of the system, including increasing the time to deploy and retrieve the streamer and also increasing the number of connections required in the system (thereby increasing the possible points of failure and water ingress). The use of canisters also increases the overall price of the system, making that solution even more unattractive.

Marine surveying may include, for example, seismic and/or electromagnetic surveying, among others. For example, this disclosure may have applications in marine surveying, in which one or more sources are used to generate wave-fields, and receivers—either towed or ocean bottom—receive a reflection of the energy generated by the sources, wherein the reflected energy is affected by the interaction of the generated wave-field with the subsurface formation. The receivers (or sensors) may be measuring devices that record various properties of the reflected energy, such as the strength of the energy. The receivers may also take various measurements over time, for example within a time period that may include when the energy is generated to when the receivers detect the reflected energy. These measurements may include one or more time periods for the energy to travel through the various layers in the earth's crust.

The receivers (or sensors) used in marine surveying may be located within streamers that may be towed behind a moving vessel. According to some embodiments, the vessel may include one or more energy generating sources (e.g., an airgun, a marine vibrator, etc.) and one or more streamers including the sensors. Each streamer may contain one or more sensors that detect (e.g., measure) reflections of energy generated by the source(s), as described above. The sensors of a streamer may extend along a length of the steamer so as to provide a number of sensors collecting data along a first spatial dimension (e.g., along the length of the streamer). Note that streamers may comprise a plurality of interconnected sections, wherein each section includes one or more sensors. The streamer sections may be modular, allowing a single section of a streamer comprising multiple interconnected sections to be replaced. Each streamer section may range from approximately 50 to 100 meters in length, although other lengths are contemplated. Streamers may vary in length, for example according to the requirements of the survey. Streamers may range from 3 to 12 kilometers in length, although streamers of different lengths (both shorter and longer) do not depart from the scope of the present disclosure. Note that a vessel may tow a plurality of streamers that extend in parallel (or parallel to within a tolerance, such as within 1 degree, 5 degrees, 10 degrees, among others) behind the vessel so as to provide an increase in collected data as compared to a survey that includes a single streamer.

A streamer may include various components to aid in marine surveying. As noted above, a streamer may include a number of sensors that measure one or more metrics of interest to a surveying operation. For example, a streamer may include a hydrophone that measures the energy reflected by a subsurface formation, as described above. A hydrophone may be any sensor capable of detecting changes in pressure. The hydrophone and/or electronics coupled to the hydrophone may convert the detected pressure change to an electrical signal, which may then be transmitted to a computer on the vessel (e.g., for storage and/or analysis), such as computing device 1000. A streamer may include one or more motion sensors that measure acceleration in one or more dimensions. The motion sensor may be any sensor that measures motion or acceleration, such as a microelectromechanical systems (MEMS) accelerometer. According to some embodiments, measurements from motion sensor(s) may be analyzed with measurements from hydrophone(s), for example to achieve a higher signal to noise ratio.

A streamer may include one or more stress members that provide the mechanical strength that allows the streamer to be towed behind the vessel. The stress members may be made of any material that allows the streamer to be towed without breaking, such as steel or a synthetic material. A streamer may include an outer sheath, such as a skin, that houses the internal components of the streamer and provides a barrier for the protection of the internal components.

Figure 1:
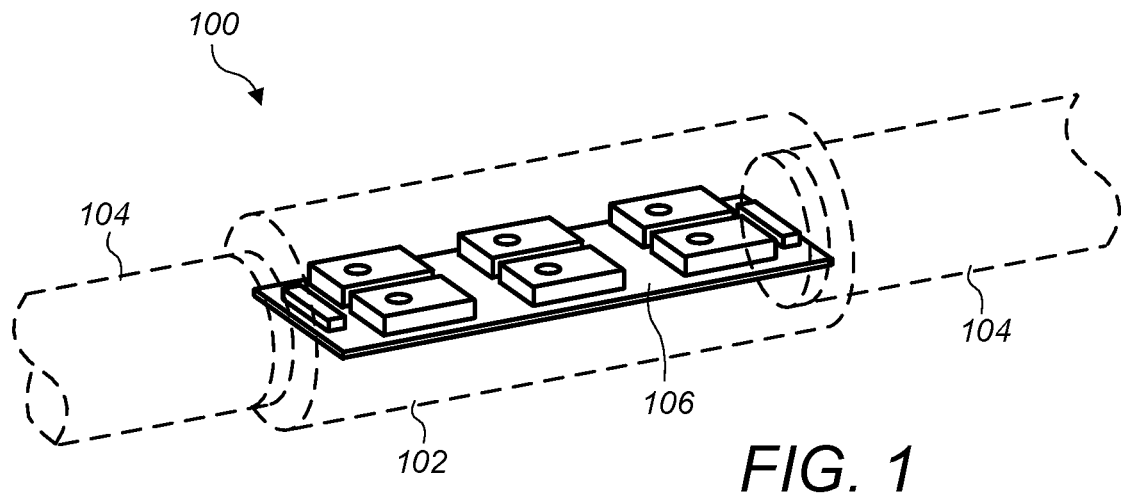
FIG. 1 is a diagram illustrating various embodiments of a seismic streamer featuring a canister.

While the invention is susceptible to various modifications and alternative forms, specific embodiments thereof are shown by way of example in the drawings and are herein described in detail. It should be understood, however, that the drawings and detailed description thereto are not intended to limit the disclosure to the particular form disclosed, but on the contrary, the intention is to cover all modifications, equivalents, and alternatives falling within the spirit and scope of the present disclosure, including the appended claims. Particular features, structures, or characteristics may be combined in any suitable manner consistent with this disclosure.

It is to be understood that the terminology used herein is for the purpose of describing particular embodiments only, and is not intended to be limiting. As used herein, the singular forms "a," "an," and "the" include singular and plural referents unless the content clearly dictates otherwise. Furthermore, the words "can" and "may" are used throughout this application in a permissive sense (i.e., having the potential to, being able to), not in a mandatory sense (i.e., must). The terms "comprise" and "include," and derivations thereof, mean "including, but not limited to." The term "coupled" means directly or indirectly connected.

Within this disclosure, different entities (which may in some cases be referred to as "circuits" or other components) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

DETAILED DESCRIPTION

A streamer may include one or more electronic systems that provide various functions for the streamer, such as data collection, data transmission, and power. The streamer may include one or more circuits (e.g., a circuit on and/or mounted to a circuit board, such as a printed circuit board (PCB)) that provide the functionality listed above. A streamer may include a circuit that interacts with the sensors, for example by reading a measurement of a pressure sensor or a motion sensor. The streamer may include a circuit that transmits the collected data, for example by digitizing a received analog signal and transmitting the digital signal to the vessel. The streamer may include a power system that includes a power circuit—i.e., a circuit configured to perform a task relating to power, such as the power supply voltage of the streamer. A power circuit may, for example, transform (e.g., reduce) power received from the vessel from a first voltage level (e.g., the level of the power supply voltage of the streamer) to a second, lower voltage level (e.g., a voltage level used by a particular local section of the streamer). In this manner, a power circuit may be used to effectuate voltage down-conversion. Additionally or alternatively, a power circuit may provide both main and redundant voltage switching of the power supply voltage of the streamer. Note that each of the functions described above may be carried out by a single circuit or by multiple circuits, and that any one circuit may perform one or more of the above functions. For example, a single circuit may both interface with a sensor to collect the measurement data and may also digitize the received measurement for transmission.

The electronic functions described above may be implemented within one or more interconnected sections of the streamer. Specifically, within a streamer that comprises multiple interconnected sections, a subset of the sections of the streamer (wherein the subset includes a single section, a plurality of sections, or every section) may perform the above functions using one or more circuits implemented within each section of the subset. Streamer sections may, in some cases, range from 50 meters to 100 meters in length, although other lengths do not depart from the scope of the disclosure. Further discussion of the above functions is presented below in the context of the embodiments disclosed herein.

Previous implementations of electronics within streamers include the use of canisters that house electronics within the streamers. But the use of canisters entails various drawbacks. For example, the canisters, which may be made of titanium (e.g., for its corrosion resistance property) or another similar metal, may be expensive, thereby increasing the cost of the system overall. In addition to increasing the costs of the system, the use of canisters may include various mechanical problems. Seismic streamers are flexible and are therefore amenable to storage around streamer reels (e.g., on board a vessel before and/or after streamer deployment). This storage mechanism may be beneficial at least in part because of its efficient use of storage space and because of the ease of deployment and retraction of the steamer associated therewith. The canisters are inflexible portions of the otherwise flexible streamer, and thus may introduce complications. The use of inflexible canisters may give rise to various stresses within the streamer and the canister—stresses that may increase the amount of fatigue of these components and therefore decrease their useful lives. Furthermore, the use of canisters causes difficulties with handling and with the overall reliability of the system, including increasing the time to deploy and retrieve the streamer and also increasing the number of connections required in the system (thereby increasing the possible points of failure and water ingress).

Additional problems with the use of canisters are discussed in reference to FIG. 1. FIG. 1 illustrates a portion of streamer 100 that includes canister 102 and the remainder of the streamer 104. As noted above, the canister may house various electronic systems, including electronics 106 as illustrated. Because the diameter of canister 102 is larger than the diameter of the remainder of the streamer 104, storage of the streamer is less efficient than it would be without a canister (e.g., because inclusion of the canister requires larger storage reels to store the streamer). Additionally, the larger, inflexible canisters may impinge on the remainder of the streamer when stored, introducing further stresses on the streamer that may decrease the streamer's useful life. As illustrated in FIG. 1, individual components of electronics 106 may be affixed to a printed circuit board such that each component is directly mounted on the printed circuit board (e.g., a side of each component directly interfaces with a surface of the printed circuit board). The inventor has recognized that this configuration may not be as efficient in terms of space utilization as other configurations, as described in greater detail below.

Figure 2:
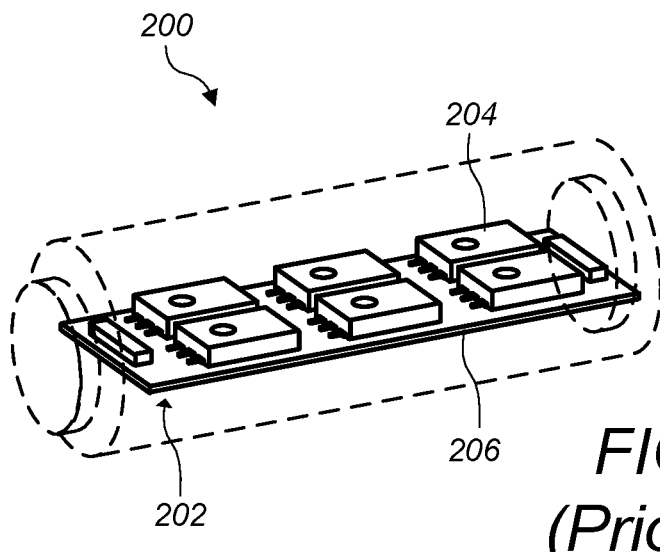
FIG. 2 is a diagram illustrating various embodiments of a canister housing electronics.

As discussed above, streamers may include various electronic systems, at least some of which may be housed in canisters. FIG. 2 illustrates streamer canister 200 with a power circuit 202 that is housed therein, according to some embodiments. A streamer may be required to perform one or more functions that require use of a high voltage switch. For example, a streamer may be required to down-convert a voltage received from the vessel to a lower voltage level. According to some embodiments, down-conversion employs a switching device, which may include the use of transistors or transistor packages. Down-converting from a higher voltage level may require larger components within the switching device, which may be housed within a canister of a streamer. Additionally or alternatively, power circuit 202 may provide redundant power switching functionality.

In other embodiments, a high-voltage switch may be used for functionality such as on/off power switching of the streamer. Such power switching enables a sequential power up, which may help with troubleshooting and also may limit an amount of and of current and/or power to the circuit. Power switching makes it possible to enable and/or disable the power supply to different portions of the streamer. Such functionality may be useful for troubleshooting a malfunctioning streamer or addressing a safety concern. Power switching may also provide power redundancy schemes. As illustrated in FIG. 2, canister 200 may include one or more transistor packages 204 mounted on circuit board 206, where the electronics comprising transistor packages 204 and circuit board 206 are configured to perform down-conversion similar to that discussed above. In other words, a power system that includes transistor packages 204 may be configured to down-convert a voltage from a first voltage level to a second, lower voltage level. According to some embodiments, the transistor packages may be a portion of a power system that may be configured to down-convert a voltage received from a vessel from a first voltage level to a second, lower voltage level. In one particular type of application, for example, the first voltage may include voltages over 600 volts (e.g., between 600 to 1200 volts), and the second voltage may include voltages under 50 volts (e.g., 30 to 35 volts). As the power requirements of marine surveying systems increases, the size of the electronic components may also increase. In other words, larger electronic components may be required to handle the higher voltage level of some marine surveying systems (e.g., in order to achieve high voltage or low power dissipation requirements). Furthermore, future generations of seismic streamers may include streamers with smaller diameters (e.g., some streamers may have diameters of approximately 45 to 55 millimeters), imposing further limits on the amount of space within the streamer itself. The above drawbacks associated with the use of canisters in seismic streamers may be addressed by the various embodiments discussed herein.

Figure 3:
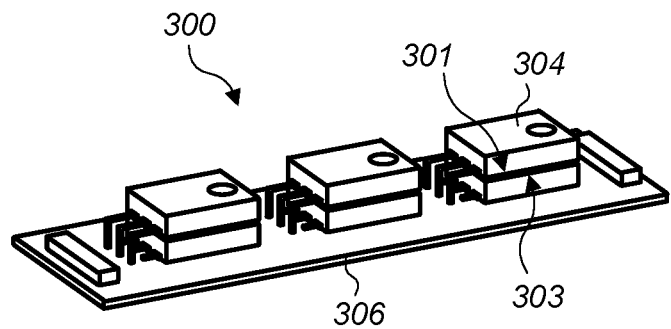
FIG. 3 is a diagram illustrating various embodiments of electronics with stacked transistor packages.

FIG. 3 illustrates a diagram of electronics 300 with stacked transistor packages, according to some embodiments. The term "stacked transistor packages" refers to transistor packages whose terminals are configured to couple to a common connector (e.g., a PCB that mechanically supports and electrically connects electronic components using conductive tracks and pads etched into the board); these stacked transistor packages are arranged such that a first transistor package of the stacked transistor packages is disposed between a reference plane (e.g. the PCB) and a second transistor package of the stacked transistor packages (note that there may be two or more transistor packages in the stacked transistor packages). Accordingly, a power circuit might include first, second, third, and fourth transistors stacked within a single cover in some embodiments, or, in alternate embodiments, include first and second transistor packages within a first cover and include third and fourth transistor packages within a second cover. As noted, such power circuits may be used for example to perform power supply voltage manipulations such as down-conversion or redundant power switching.

As shown in FIG. 3, transistor packages are stacked relative to circuit board 306. One package 304 is shown in which a surface 301 of a "top" (or "first") transistor opposes a surface 303 of a "bottom" (or "second") transistor. (Note that the surfaces in question are each substantially parallel (i.e., within 5% of parallel) to a reference plane extending through circuit board 306.) In some cases, surfaces 301 and 303 may physically touch one another. In other cases, surfaces 301 and 303 may be separated—for example by an insulator (e.g., a mica insulator), by epoxy, and/or by an air gap. Thus, one transistor package is disposed between the other transistor package and the circuit board. In various embodiments, the term "stacked" indicates varying degrees of overlap between surfaces of the bodies of the transistor packages that are substantially parallel to some reference plane (e.g., circuit board 306). (As used herein, "overlap" relates to the bodies of the transistor packages that are substantially parallel to this reference plane, and does not contemplate any overlap of the leads).

In one example of stacking shown in FIG. 3, surfaces of the bodies of transistor packages substantially parallel to circuit board 306 have a substantially equal area, and are oriented such that the body surfaces of each transistor package completely overlap. (For purposes of this disclosure, the body surfaces of transistor packages have "substantially equal" areas if the smallest area is within 2% of the area of the largest area.) Accordingly, in these embodiments, the body surface of the first transistor package (e.g., surface 301) completely overlaps the opposing body surface of the second transistor package (e.g., surface 303).

In other embodiments, a first stacked transistor package may be offset from a second stacked transistor package having a substantially equal body surface area such that the respective profiles of the bodies of each transistor package partially overlap. In other words, an area defined by the overlap of a body surface of the first stacked transistor package and a body surface of the second stacked transistor package may be less than an area of either body surface. Note that a ratio of the area of overlap to an area of the body surfaces of the first or second transistor packages may vary (this ratio may vary between 0.25 and 0.999 . . . in various cases, and does not include the leads of the package).

In still other embodiments, an area of a body surface of a first stacked transistor package may differ from an area of a corresponding body surface of a second stacked transistor package. For example, the area of a body surface of the first stacked transistor package may be greater than or less than an area of an opposing body surface of the second stacked transistor package, where the first stacked transistor package is disposed between the second stacked transistor package and a reference plane (e.g., a circuit board). In these embodiments, while a larger transistor package in a stack may completely overlap a smaller transistor package, the reverse would not be true. It can also be the case that neither of two transistor packages having different areas completely overlaps the other if neither set of ends of the bodies of the transistor packages are aligned.

Finally, because the present disclosure contemplates that more than two transistor packages may be stacked, it may be the case that different orientations of transistor packages (as variously described above) may exist within a given stacking. Consider an example in which three transistor packages are stacked: the "top" and "middle" transistor packages may have substantially equal opposing body surface areas and completely overlap one another, while the "bottom" transistor package may have a different body surface area, and thus only partially overlap with an opposing body surface of the "middle" transistor package. Accordingly, within a given transistor package stacking, various transistor package sizing and degrees of overlap are contemplated.

According to some embodiments, a plurality of transistors (e.g., a plurality of metal-oxide-semiconductor field effect transistors (MOSFETs), such as silicon carbide MOSFETs) may be stacked in a sequence of transistors. A stacked sequence might also include other types of transistors, such as junction gate field-effect transistors (JFETs), bipolar junction transistors (BJTs), etc. According to an illustrated embodiment, FIG. 3 shows six transistor packages 304 that are stacked (e.g., stacked vertically relative to a direction normal to a circuit board) in groups of two and are mounted to circuit board 306. Note that any number of transistor packages may be stacked according to the embodiments disclosed herein (e.g., first, second, third, and fourth transistor packages may be stacked within a single cover, in some embodiments). As an example, silicon carbide MOSFETs may be chosen for switching voltages above a certain threshold (e.g., over 600 volts, over 800 volts, etc.). An example of a transistor outline (TO) package that may be used to house a MOSFET or other type of transistor or electronic component is a TO-247. The phrase "transistor package" and "transistor outline (TO) package" are used interchangeably herein. A transistor package or a TO package is a device that includes a discrete transistor (i.e., an individual transistor (MOSFET, JFET, BJT, etc.), rather than a transistor found in an integrated circuit), a casing, and leads, and may include one or more components that amplify and/or switch electronic signals and/or electrical power. For example, a transistor package may include one or more transistors and/or one or more diodes that are configured to perform power switching. Transistor packages may be classified according to a physical footprint of the transistor package, and transistor packages may be configured for various voltage and/or current ratings (e.g., according to ratings designated by a manufacturer of a transistor package). Any suitable transistor package may be used according to the present disclosure, including TO-218, TO-220, TO-262, TO-247, TO-220FP, TO-251, TO-254, TO-257, TO-258, TO-259, TO-264, and TO-267, among others.

By stacking the transistor packages as described herein, a power switching density may be increased, making possible the implementation of power redundancy and compactness in space-constrained applications, such as in marine seismic streamers. Note that different applications may require different configurations of stacked transistor packages. For example, a redundant power scheme may require more transistors than a non-redundant power scheme. Thus, in some cases, a redundant power configuration may require four transistor packages while a non-redundant configuration may require only two transistor packages. By using a configuration of transistors that is more efficient in terms of space utilization, the power switching density (e.g., power switching per unit volume) may be increased, for example by including an increased number of transistors and/or by including larger transistors within the same spatial volume. Additionally and/or alternatively, the power switching density may be increased by maintaining the number and/or size of transistors within a lesser spatial volume.

Figure 4:
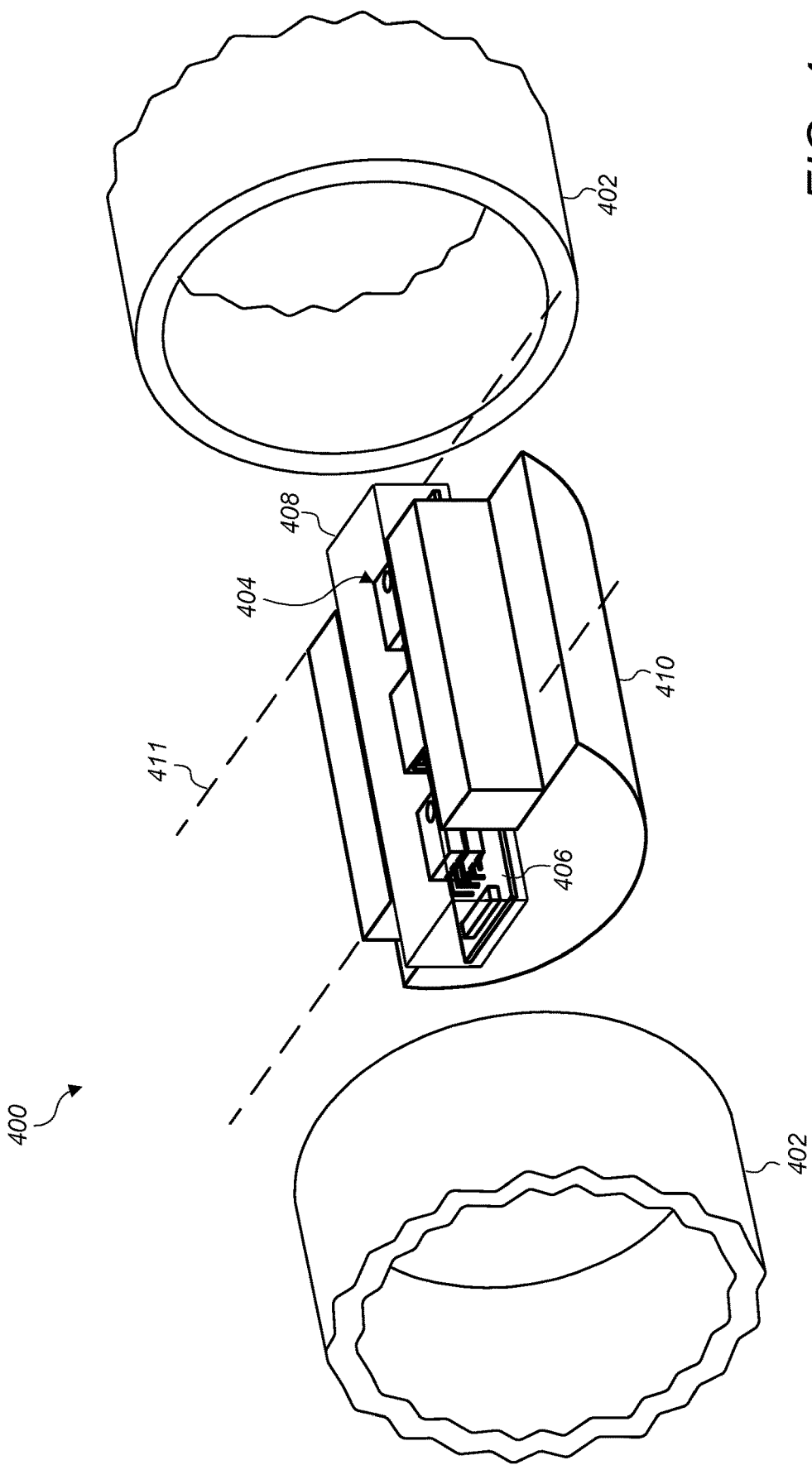
FIG. 4 is a diagram illustrating various embodiments of a streamer featuring stacked transistor packages.

FIG. 4 illustrates a plurality of stacked transistor packages 404 that are mounted on circuit board 406 within seismic streamer 402, according to some embodiments. (Streamer 402 is shown in a cutaway view so as to illustrate the placement of circuit board 406. Further, note that only the middle stacking of transistor packages on circuit board 406 is shown covered; the packages on either end are shown uncovered for illustration purposes but all may be covered in various implementations.) Transistor packages 404 and circuit board 406 may operate within a power system that provides power to at least a portion of streamer 402 (e.g., to one or more sections of a plurality of interconnected sections of streamer 402). Note that the spatial efficiency achieved by stacking transistor packages 404 may in certain instances allow power switching electronics to be disposed within streamer 402 without the use of a canister. As a result, stacking transistor packages may increase efficiency of marine surveying by, for example, decreasing the costs of manufacturing (e.g., by mitigating the costs associated with manufacturing streamers that include canisters) and storing streamers (e.g., by mitigating the costs associated with storing streamers that include canisters) and increasing power redundancy (e.g., by increasing power switching density, as explained above), thereby reducing downtime resulting from isolated power failures.

Circuit board 406 may be mounted or situated within streamer 402 in a variety of ways. One such possibility is illustrated in FIG. 4, in which an enclosure 408 surrounds circuit board 406. Enclosure 408, in turn, is situated within a slot in spacer 410 that tightly holds enclosure 408. (For clarity, only a portion of spacer 410 below a plane indicated by dashed lines and reference numeral 411 is shown. An unillustrated top portion of spacer 410 would be similar to the illustrated, semicircular lower portion shown in FIG. 4.) In some instances, enclosure 408 may only fit within spacer 410 in a single direction, and will not be able to pass all the way through the spacer. Spacer 410 and enclosure 408 that includes circuit board 406 may then be fitted within streamer 402, and surrounded by a gel, which, once cured, reaches a semi-solid state. This process along with other hardware, keeps circuit board 406 in place. In other embodiments, circuit board 406 may be secured differently. For example, two rings with slots may be used to hold enclosure 408 on the edges; this configuration is similar to the spacer but with a smaller longitudinal dimension.

As discussed above, power switching electronics, including the stacked transistor packages described herein, may be disposed within a seismic streamer without the use of canisters. In other words, a seismic streamer (or a section of a seismic streamer, such as one or more of a plurality of interconnected sections) may include a first portion that houses power switching electronics (e.g., one or more components of a power circuit, such as a printed circuit board, a plurality of stacked transistor packages, a cover) and a second portion that includes a remainder of the seismic streamer (or a remainder of the section of the seismic streamer). The second portion of the seismic streamer may house one or more streamer components (e.g., sensors or receivers for measuring signals), but does not house the stacked transistor packages described herein. A diameter of the first portion and a diameter of the second portion may be the same, resulting in improved space efficiencies and reduced costs, for example by eliminating the use of canisters. For example, the diameters of the first and second portions may have the same manufacturing specifications (e.g., such that the diameters of the first and the second portions are the same to within a particular tolerance, such as 1%, 5%, etc.). Note that the first and second portions may appear indistinguishable from each other from a perspective exterior to the seismic streamer. Alternatively, the diameters of the first and second portions may be different, such that one of the first and second portions has a slightly larger diameter than the other (such as a diameter within 5%, 10%, 20%, etc.).

Figure 5:
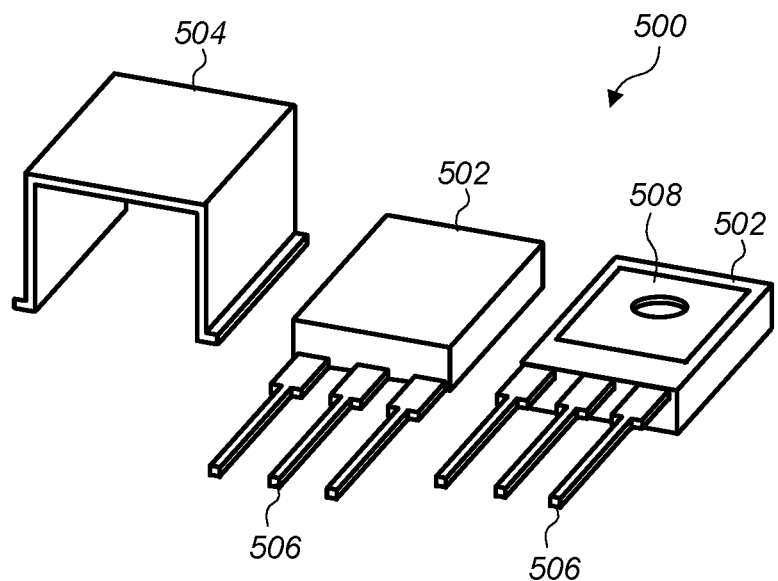
FIG. 5 is a diagram illustrating various embodiments of a pair of transistor packages and a cover.

FIG. 5 illustrates a pair of transistor packages 502 and cover 504, according to some embodiments. As noted above, the transistor packages may include one or more metal oxide semiconductor field-effect transistors (MOSFETs). A plurality of leads (or terminals) 506 may extend from a body of transistor 502. In the illustrated embodiment, leads 506, prior to further mounting steps shown below in FIGS. 6 and 7, extend adjacent and substantially parallel to lower surface 508 of each of transistor packages 502. (The term "substantially" here is a recognition that two items in the physical world may not always be precisely parallel. As used herein, one set of leads is "substantially parallel" to another set of leads if one set is within 5 degrees of being parallel to the other set.) Components 500 may include a component to cover at least a portion the plurality of stacked transistor packages, such as cover 504. For example, cover 504 is configured, when placed, to cover a "top" portion and two sides of transistor packages 502. Cover 504 may be made of one or more materials that may be soldered or otherwise affixed to a circuit board (e.g., copper, tin, and/or aluminum). According to some embodiments, cover 504 may act as a conductor so as to provide an electrical connection between lower surface 508 and a circuit board on which the stacked transistor packages may be mounted. According to other embodiments, cover 504 may act as an electrical insulator (e.g., cover 504 may be made of anodized aluminum), preventing an electrical connection between lower surface 508 and a circuit board on which the stacked transistor packages may be mounted. Note that the material or the plurality of materials of which cover 504 may be made may be chosen depending on whether an electrical connection between lower surface 508 and a circuit board is desired. According to some embodiments, cover 504 may serve as physical protection for the plurality of stacked transistor packages. For example, cover 504 may serve as protection from impact, shock, vibration, flooding, temperature, among other types of stressors.

Figure 6:
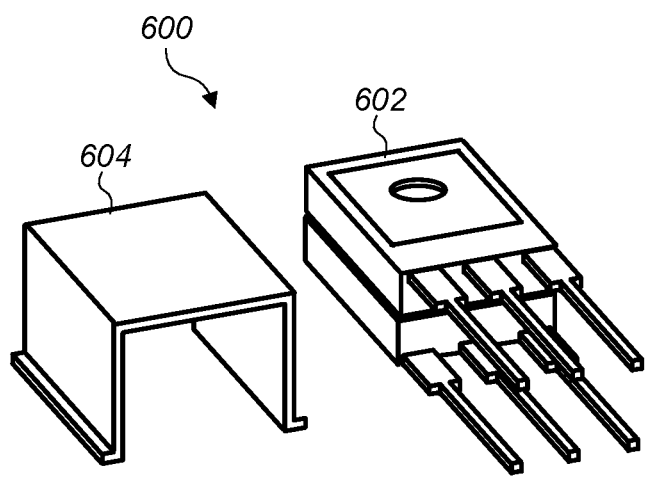
FIG. 6 is a diagram illustrating various embodiments of a pair of stacked transistor packages with a cover.

FIG. 6 illustrates a pair of stacked transistor packages with a cover, according to some embodiments. The relative orientations of each of the pair of stacked transistor packages may vary depending on the requirements of the power system. In the illustrated embodiment, a first transistor package may be inverted relative to a second transistor package when stacked upon the second transistor package. Note that the phrases "first transistor package" and "second transistor package" are used herein for descriptive purposes only and that either transistor package may be referred to as the "first transistor package" or the "second transistor package." Inverting a transistor package may serve to increase a distance between the leads of the first transistor package and the leads of the second transistor package. According to some embodiments, the plurality of leads of the first transistor package and the plurality of leads of the second transistor package may extend in a same direction, as illustrated by transistor packages 602 of FIG. 6. According to other embodiments, the plurality of leads of the first transistor package and the plurality of leads of the second transistor package may extend in a different (e.g., opposite) direction. The inverted position of the first transistor package shown in FIG. 6 may leave a first surface of the first transistor package exposed. According to some embodiments, the first surface of the first transistor package may include a connection (such as a thermal pad and/or an electrical conduit) on the outside (e.g., as shown on the first transistor package of transistor packages 602).

According to some embodiments, cover 604 may serve as a heatsink for the plurality of stacked transistor packages 602. In at least one embodiment, cover 604 may serve as an electrical connection for at least one of the plurality of stacked transistor packages 602 (e.g., the first transistor package, as illustrated in FIG. 6). If cover 604 is not utilized as an electrical connection for the first transistor package, the connection of the first transistor package may be electrically isolated (e.g., by using mica insulators and/or by creating a cover that is thermally conductive but electrically isolated, such as may be accomplished by use of anodized aluminum). Note that the configuration of the leads may be selected based on factors such as the creepage needed between leads, and/or the PCB layout.

Figure 7:
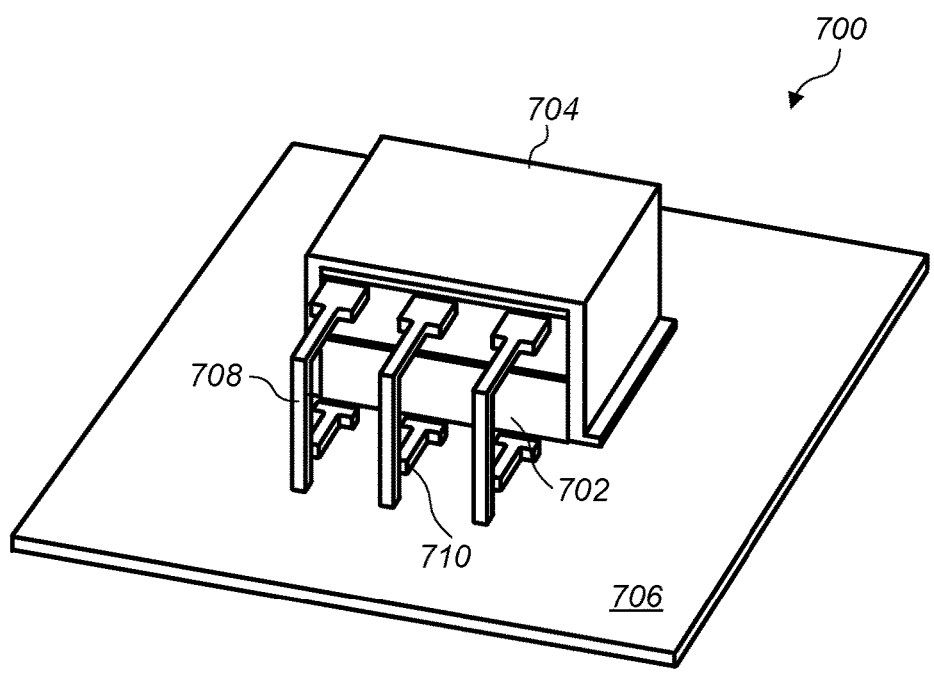
FIG. 7 is a diagram illustrating various embodiments of a pair of stacked transistor packages mounted to a circuit board.

FIG. 7 illustrates a diagram of a pair of stacked transistor packages mounted to a circuit board, according to some embodiments. As an example of a process for forming the stacked transistor packages, one of the transistor packages (e.g., a first transistor package) may be placed upon one of the other transistor packages (e.g., a second transistor package), as shown in FIGS. 6 and 7. As illustrated in FIG. 7, stacked transistor packages 702 may be placed upon (e.g., mounted to) circuit board 706. In some embodiments, a second transistor package may be placed upon the circuit board and a first transistor package may be placed upon the second transistor package. Cover 704 may be placed over the stacked transistor packages 702, as shown in FIG. 7. Cover 704 may be affixed to circuit board 706 according to processes known in the art (e.g., via soldering and/or via through-hold attachment). Cover 704 may be wider than the stacked transistor packages 702 such that an area of circuit board 706 that is occupied by cover 704 may be slightly wider than the area occupied by transistor packages 702 alone. According to some embodiments, transistor packages 702 may be through-hole or surface-mounted transistor packages. Note that because cover 704 may be soldered down upon circuit board 706, bolting the transistor packages to the circuit board may optionally be omitted (e.g., so as to mitigate the effects shock and/or vibrations). Thus, avoiding through-hole mounting may therefore increase the area usable for other purposes on one or both sides of the circuit board.

As noted above, the transistor packages of the present disclosure may be stacked according to a plurality of configurations. According to the illustrated embodiment in FIG. 7, leads 708 of a first transistor package and leads 710 of a second transistor package initially extend in the same direction in a substantially parallel manner. As shown, leads 708 and leads 710 of transistor packages 702 may be bent and/or trimmed to facilitate coupling of leads 708 and 710 to circuit board 706 (e.g., to establish respective electrical connections between leads 708 and 710 and circuit board 706). As illustrated in FIG. 7, leads 708 are bent and leads 710 are trimmed. Leads 708 and leads 710 may be bent and/or trimmed to increase clearance between each other and/or to facilitate coupling to circuit board 706.

Figure 8:
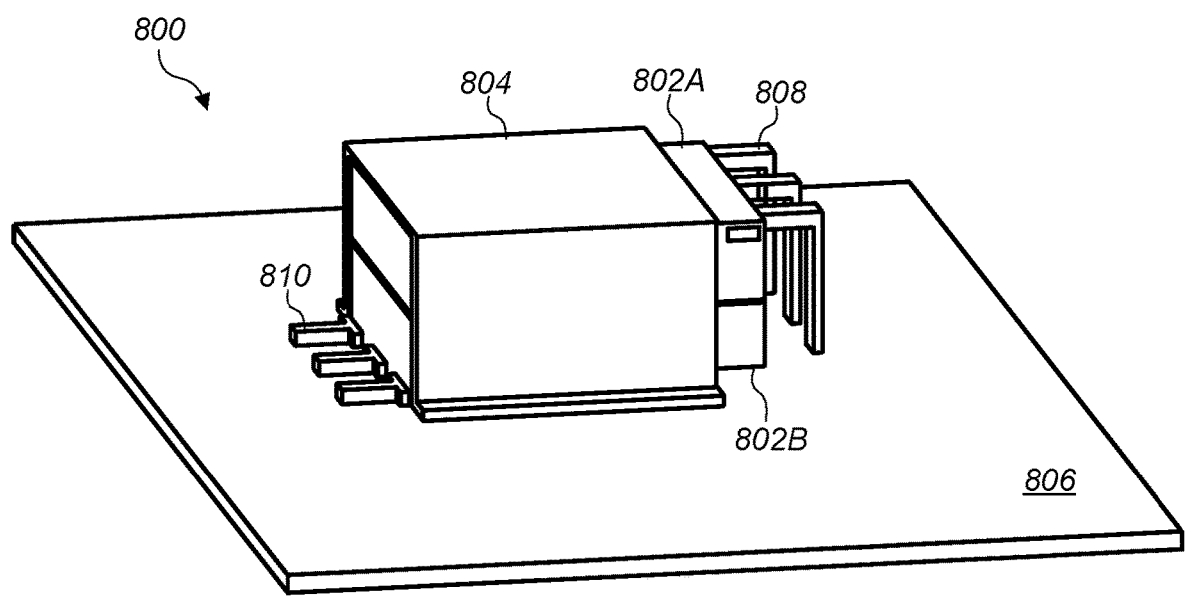
FIG. 8 is a diagram illustrating various embodiments of a pair of stacked transistor packages mounted to a circuit board.

FIG. 8 illustrates a diagram of a pair of stacked transistor packages (represented collectively by the reference numeral 802) mounted to a circuit board, according to some embodiments. In the illustrated embodiment, cover 804 is a U-shaped structure that surrounds stacked transistor packages 802 on three sides. According to the illustrated embodiment in FIG. 8, leads 808 of a first transistor package 802A and leads 810 of a second transistor package 802B may initially extend in opposite directions in a substantially parallel manner. Rotation of the first transistor package relative to the second transistor package may contribute to increasing clearances between leads 808 and 810. Increasing clearance between the leads of the respective transistor packages may be important in some applications, such as in cases dealing with high voltage applications). According to some embodiments, leads 808 and leads 810 of transistor packages 802 may be bent and/or trimmed to facilitate coupling of leads 808 and 810 to circuit board 806 (e.g., to establish respective electrical connections between leads 808 and 810 and circuit board 806). As illustrated in FIG. 8, leads 808 are bent and leads 810 are trimmed. Leads 808 and leads 810 may be bent and/or trimmed to increase clearance between each other and/or to facilitate coupling to circuit board 806. Note that one or more standards may provide minimum clearances for electrical conductors depending on the voltage levels involved. For example, the IPC-2221 establishes generic standards on printed board design that include electrical conductor spacing standards. One or more of the above techniques may be used to meet such standards for electrical clearance.

Figure 9:
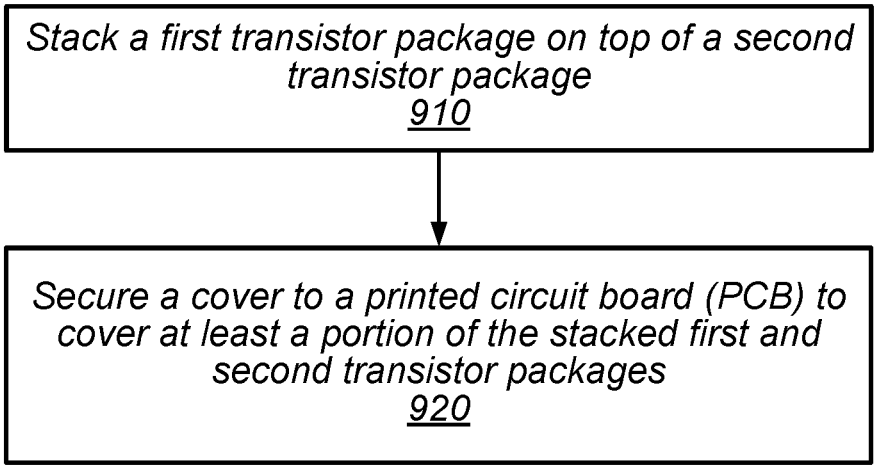
FIG. 9 is a flow diagram illustrating an example method of manufacturing a seismic streamer power circuit.

FIG. 9 illustrates a flow diagram illustrating a method of manufacturing a circuit, according to some embodiments. At 910, a first transistor package is stacked upon a second transistor package. The transistor packages of 910 may be any of the transistor packages described above, including, for example, the TO-247. According to some embodiments, the first transistor package and the second transistor package may be configured such that a plurality of leads of the first transistor package extend in the same direction as a plurality of leads of the second transistor package. An example of such a configuration is illustrated in FIG. 7. According to other embodiments, the first transistor package and the second transistor package may be configured such that a plurality of leads of the first transistor package extend in the opposite direction as a plurality of leads of the second transistor package. An example of such a configuration is illustrated in FIG. 8. As noted, any suitable number of transistor packages may be stacked—for example, first, second, third, and fourth transistors may be stacked within a single cover in some embodiments. As previously noted, stacking in step 910 may have several advantageous effects. In the context of using this method within seismic streamers these advantages may include increased power switching density, decreased manufacturing costs, and reduced streamer storage requirements.

At 920, the stacked first and second transistor packages are secured to a circuit board via a cover, where the cover physically interfaces with the first transistor package and the circuit board. The cover may be made of one or more materials that may be soldered or otherwise affixed to a circuit board (e.g., copper, tin, and/or aluminum). According to some embodiments, the cover may act as an electrical conductor so as to provide an electrical connection between a connection (such as a thermal pad and/or an electrical conduit) of the first transistor package and the circuit board. According to other embodiments, the cover may act as an electrical insulator, preventing an electrical connection between a connection of the first transistor package and the circuit board. The material or the plurality of materials of which the cover is made may be chosen depending on whether an electrical connection between a connection of the first transistor package and the circuit board is desired. According to some embodiments, the cover may serve as physical protection for the first and the second transistor packages. For example, in the context of a seismic streamer section, the cover may serve as protection from various types of stressors. The cover may help against vibration and shock by holding the transistors to the PCB if the cover is soldered, bolted to, or otherwise affixed to the PCB. The cover may also help to dissipate heat by acting as a small heatsink in some embodiments.

In some embodiments, method 900 may further comprise mounting the printed circuit board to mounting hardware within a section of a seismic streamer—for example, using enclosure 408 and spacer 410 as described above with reference to FIG. 4.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure. Note that the use of stacked transistor packages is not intended to be limited to power circuits or the field of marine seismic streamers unless specifically stated. On the contrary, stacked transistor packages as disclosed herein may be utilized in any suitable field of electronics.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    a first transistor package and a second transistor package that have separate electrical connections to a printed circuit board (PCB) through respective leads, wherein the first transistor package is stacked upon the second transistor package; and
    a cover coupled to the PCB and configured to cover a portion of the stacked first and second transistor packages;
    wherein the first transistor package, the second transistor package, the cover, and the PCB are part of a power circuit within a section of a seismic streamer.

2. The apparatus of claim 1, wherein the section of the seismic streamer is one of a plurality of interconnected sections that receive a power supply voltage from a vessel attached to the seismic streamer, wherein the power circuit is configured to operate on the received supply voltage.

3. The apparatus of claim 1, wherein the section of the seismic streamer includes a first portion that houses the apparatus and a second portion comprising a remainder of the section of the seismic streamer, and wherein a diameter of the first portion is the same as a diameter of the second portion.

4. The apparatus of claim 1, wherein the leads of the first transistor package and the leads of the second transistor package extend in the same direction.

5. The apparatus of claim 1, the power circuit further including:
    a third transistor package and a fourth transistor package, wherein the third transistor package is stacked upon the fourth transistor package.

6. The apparatus of claim 5, wherein the third and fourth transistor packages are within the cover and stacked on the first and second transistor packages.

7. The apparatus of claim 5, wherein the third and fourth transistor packages are within a second cover coupled to the PCB.

8. The apparatus of claim 5, wherein the first, second, third, and fourth transistor packages are configured to down-convert a received power supply voltage from a first voltage level to a second, lower voltage level, and wherein the third and fourth transistor packages are within a second cover coupled to the PCB and configured to cover at least a portion of the third and fourth transistor packages.

9. The apparatus of claim 8, wherein the first voltage level is above 600 volts.

10. The apparatus of claim 5, wherein the first and second transistor packages are configured to provide main power switching for a seismic streamer, and wherein the third and fourth transistor packages are configured to provide redundant power switching for the seismic streamer.

11. A seismic streamer comprising a plurality of interconnected sections, wherein a first of the plurality of the interconnected sections comprises a power circuit that includes:
a printed circuit board (PCB);
a first transistor package and a second transistor package that have separate electrical connections to the PCB through respective leads, wherein the first transistor package is stacked upon the second transistor package; and
a cover coupled to the PCB and configured to cover at least a portion of the stacked first and second transistor packages.

12. The seismic streamer of claim 11, wherein the power circuit is configured to down-convert a received power supply voltage from a first voltage level to a second, lower voltage level.

13. The seismic streamer of claim 11, wherein the first and the second transistor packages comprise metal oxide semiconductor field effect transistors (MOSFETs).

14. The seismic streamer of claim 11, wherein the first interconnected section includes a first portion that houses the PCB, the first transistor package, the second transistor package, and the cover and a second portion comprising a remainder of the first interconnected section, and wherein a diameter of the first portion is the same as a diameter of the second portion.

15. The seismic streamer of claim 11, wherein the power circuit further includes a third transistor package and a fourth transistor package, wherein the third and fourth transistor packages are configured to provide redundant power switching for main power switching provided by the first and second transistor packages.

16. A method of manufacturing a circuit, comprising:
stacking a first transistor package upon a second transistor package;
connecting respective leads of the first and second transistor packages to a printed circuit board (PCB) such that the first and second transistor packages have separate electrical connections to the PCB through the respective leads;
securing a cover to the PCB to cover at least a portion of the stacked first and second transistor packages; and
mounting the PCB within a section of a seismic streamer.

17. An apparatus, comprising:
a first transistor package and a second transistor package that have separate electrical connections to a printed circuit board (PCB) through respective leads, wherein the first transistor package is stacked upon the second transistor package; and
a cover coupled to the PCB and configured to cover a portion of the stacked first and second transistor packages;
wherein the leads of the first transistor package and the leads of the second transistor package extend in opposite directions.

18. An apparatus, comprising:
a first transistor package and a second transistor package that have separate electrical connections to a printed circuit board (PCB) through respective leads, wherein the first transistor package is stacked upon the second transistor package; and
a cover coupled to the PCB and configured to cover a portion of the stacked first and second transistor packages;
wherein each of the first and the second transistor packages comprise a discrete transistor and a casing affixed to the discrete transistor, wherein the discrete transistors in the first and second transistor packages are metal oxide semiconductor field effect transistors (MOSFETs).

* * * * *